(12) United States Patent
Lee et al.

(10) Patent No.: US 8,058,653 B2
(45) Date of Patent: Nov. 15, 2011

(54) THIN FILM TRANSISTOR ARRAY PANEL

(75) Inventors: Son-Uk Lee, Yongin-si (KR); Sung-Jim Kim, Seongnam-si (KR); Jeong-Kuk Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 82 days.

(21) Appl. No.: 12/323,218

(22) Filed: Nov. 25, 2008

(65) Prior Publication Data

US 2009/0206340 A1      Aug. 20, 2009

(30) Foreign Application Priority Data

Feb. 20, 2008   (KR) ......................... 10-2008-0015419

(51) Int. Cl.
*H01L 27/14* (2006.01)
(52) U.S. Cl. ........ 257/72; 257/81; 257/E23.07; 257/E23.151; 349/149; 349/150; 349/151; 349/152; 438/128; 438/149

(58) Field of Classification Search ..................... 257/72, 257/81; 349/152
See application file for complete search history.

(56) References Cited

U.S. PATENT DOCUMENTS

| | | | |
|---|---|---|---|
| 2002/0122143 A1* | 9/2002 | Woo et al. ....................... | 349/42 |
| 2004/0165138 A1* | 8/2004 | Hwang et al. ................. | 349/152 |
| 2006/0258068 A1* | 11/2006 | Moriya et al. ................ | 438/158 |
| 2008/0017859 A1* | 1/2008 | Tai et al. ......................... | 257/59 |

* cited by examiner

*Primary Examiner* — Benjamin Sandvik
*Assistant Examiner* — Farid Khan
(74) *Attorney, Agent, or Firm* — Innovation Counsel LLP (57) ABSTRACT

A thin film transistor array panel is provided according to one or more embodiments. In an embodiment, the thin film transistor array panel includes: a base substrate that has a display area and a peripheral area; a plurality of thin film transistors that are formed in the display area; a plurality of signal input pads that are formed in the peripheral area and that are formed long in a first direction; and a plurality of signal lines that are connected to the thin film transistors and the signal input pads, wherein at least a part of each of the plurality of signal input pads is arranged in a line along the first direction.

26 Claims, 9 Drawing Sheets

THIN FILM TRANSISTOR ARRAY PANEL

CROSS-REFERENCE TO RELATED APPLICATION

This application claims priority to and the benefit of Korean Patent Application No. 10-2008-0015419 filed in the Korean Intellectual Property Office on Feb. 20, 2008, the entire contents of which are incorporated herein by reference.

BACKGROUND (a) Technical Field

Embodiments of the present invention generally relate to a thin film transistor array panel.

(b) Description of the Related Art

In a thin film transistor array panel that is used in a general display device, a plurality of gate lines and a plurality of data lines are formed to intersect each other, a pixel electrode and a thin film transistor, which is a switching element, are formed in an intersecting region of the gate line and the data line, and signal input pads that are electrically connected to a driving device are formed at one end of each of the gate line and the data line. The driving device is mounted in a flexible circuit layer in an integrated circuit (IC) form to be attached to a thin film transistor array panel.

The general thin film transistor array panel is manufactured to use a glass substrate as a base substrate. However, because a glass substrate is heavy and brittle, it is inappropriate to use the glass substrate in a display device that has a light weight, that endures some deformation, and that requires that it does not break on impact.

Therefore, research and development of a flexible display device that replaces a conventional glass substrate with a flexible substrate has been undertaken, and such a flexible display device is manufactured by replacing the glass substrate with a thin flexible substrate, for example, a plastic substrate.

However, unlike a conventional glass substrate, the size of the flexible substrate may change because a flexible substrate such as a plastic substrate expands or contracts according to a manufacturing environment. Particularly, in a process of bonding a flexible film in which a driving IC is mounted to a signal input pad of the plastic substrate, there is a problem in that the signal input pad and a signal pad of the flexible film are misaligned due to expansion or contraction of the substrate.

The above information disclosed in this Background section is only for enhancement of understanding of the background and therefore it may contain information that does not form the prior art that is already known in this country to a person of ordinary skill in the art.

SUMMARY

Embodiments of the present invention provide a thin film transistor array panel that may reduce a process failure by forming a signal input pad that may improve a junction margin with a flexible film for an external driving IC even if erroneous alignment occurs due to a size change of a substrate in a process of manufacturing the thin film transistor array panel.

An exemplary embodiment of the present invention provides a thin film transistor array panel including: a base substrate that has a display area and a peripheral area; a plurality of thin film transistors that are formed in the display area; a plurality of signal input pads that are formed in the peripheral area and that are elongated in a first direction; and a plurality of signal lines that are connected to the thin film transistors and the signal input pads, wherein at least a part of the plurality of signal input pads is aligned with each other along the first direction.

At least a part of the plurality of signal input pads may be sequentially arranged along a second direction substantially perpendicular to the first direction.

The plurality of signal input pads may be arranged at a predetermined interval in the first direction and at a predetermined interval in the second direction within a pad block region, and a length of the pad block region in the first direction is longer than a length thereof in the second direction.

The plurality of signal input pads may be formed in a plurality of pad block regions, a distance between adjacent pad blocks may be greater than a distance between two of the input signal pads adjacent in the first direction within each of the pad block regions, and a length of each pad block region in the first direction may be longer than a length thereof in the second direction.

The plurality of signal input pads may be disposed adjacent to an edge of the base substrate parallel to the first direction.

The plurality of signal lines may extend in the second direction in the display area.

Another embodiment of the present invention provides a thin film transistor array panel including: a base substrate; a plurality of thin film transistors that are formed in the base substrate; a plurality of signal input pads that are disposed adjacent to an edge of the base substrate and are elongated in a first direction parallel to the edge of the base substrate; and a plurality of signal lines that are connected to the thin film transistors and the signal input pads.

The plurality of signal input pads may be sequentially arranged along the first direction and along a second direction substantially perpendicular to the first direction.

The plurality of signal input pads may be at a predetermined interval in the first direction and at a predetermined interval in the second direction within a pad block region, and a length of the pad block region in the first direction may be longer than a length thereof in the second direction.

The plurality of signal input pads may be formed in a plurality of pad block regions, a distance between adjacent pad blocks may be greater than a distance between two of the input signal pads adjacent in the first direction within each pad block region, and a length of each pad block region in the first direction may be longer than a length thereof in the second direction.

The plurality of signal lines may extend in the second direction in the display area.

Yet another embodiment of the present invention provides a thin film transistor array panel including: a base substrate that has a display area and a peripheral area; a plurality of thin film transistors that are formed in the display area; a plurality of signal input pads that are disposed in the peripheral area and that are elongated in a first direction; and a plurality of signal lines that are connected to the thin film transistor and the signal input pad and that extend in a second direction substantially perpendicular to the first direction in the display area.

The plurality of signal input pads may be sequentially arranged along the first direction and along the second direction.

The plurality of signal input pads may be arranged at a predetermined interval in the first direction and at a predetermined interval in the second direction within a pad block region, and a length of the pad block region in the first direction may be longer than a length thereof in the second direction.

The plurality of signal input pads may be formed in a plurality of pad block regions, a distance between adjacent pad blocks may be greater than a distance between two of the input signal pads adjacent in the first direction within each pad block region, and a length of each pad block region in the first direction may be longer than a length thereof in the second direction.

The thin film transistor may have a gate electrode, a source electrode, and a drain electrode, and the signal lines may be connected to the source electrodes of the thin film transistors.

The thin film transistor may have a gate electrode, a source electrode, and a drain electrode, and the signal lines may be connected to the gate electrodes of the thin film transistors.

The thin film transistor array panel may further include a passivation layer that is formed on the signal lines and a part of the signal input pads.

The base substrate may be flexible.

According to an embodiment of the present invention, a display device including a display panel and a flexible film is provided. The display panel includes a plurality of thin film transistors that are formed in a display area, a plurality of signal input pads that are formed in a peripheral area, and a plurality of signal lines that are connected to the thin film transistor and the signal input pad. The flexible film includes a plurality of driving pads that are attached to the peripheral area of the display panel and that are electrically connected to the signal input pad in a pad block region. The signal input pad and the pad block region are elongated in the same direction.

DETAILED DESCRIPTION

An exemplary embodiment of the present invention will be described hereinafter in detail with reference to the accompanying drawings.

In the drawings, the thickness of layers, films, panels, regions, etc., are exaggerated for clarity. Like reference numerals designate like elements throughout the specification. When it is said that any part, such as a layer, film, area, or plate, is positioned on another part, it means the part may be directly on the other part or above the other part with at least one intermediate part. In contrast, when an element is referred to as being "directly on" another element, there are no intervening elements present.

Figure 1:
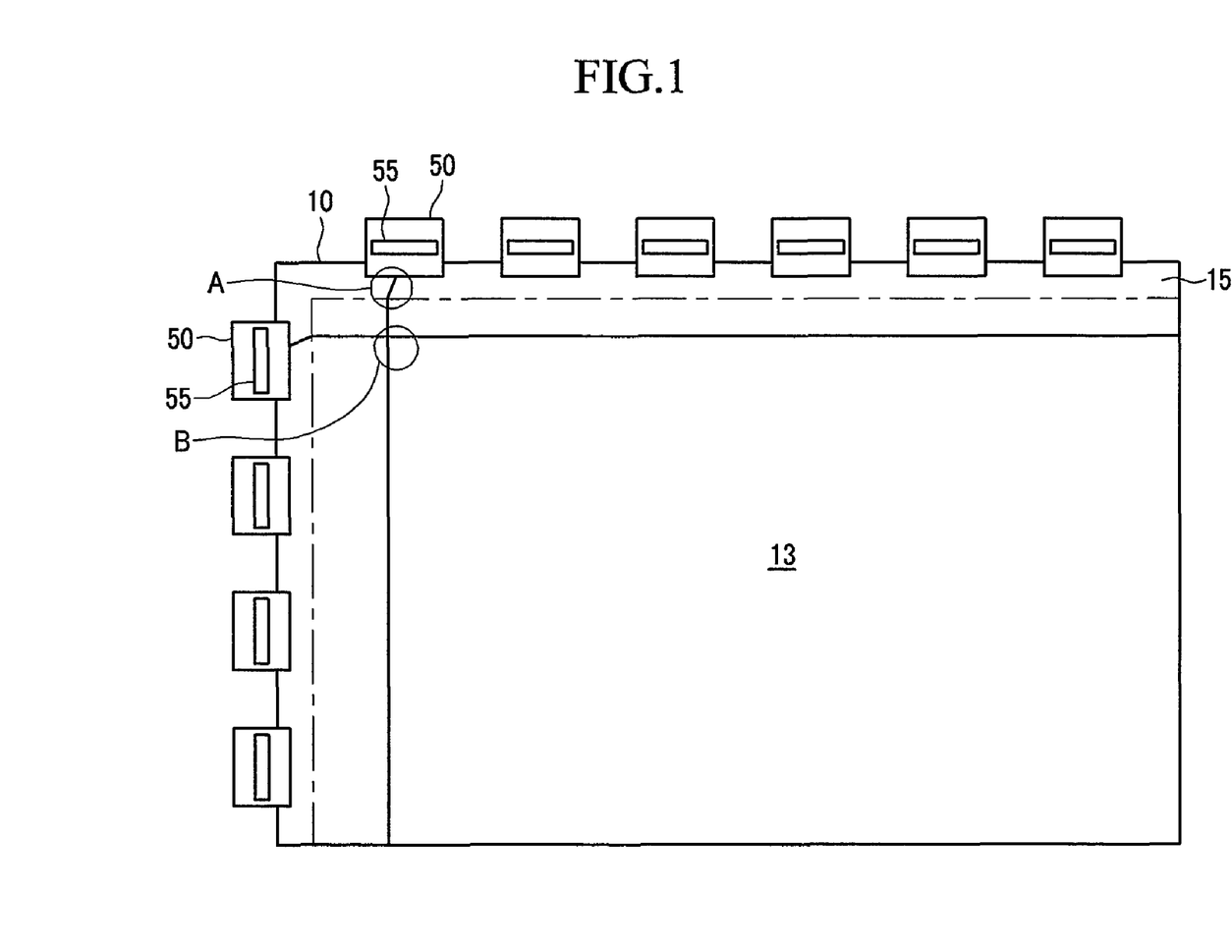
FIG. 1 is a schematic diagram of a display device according to an exemplary embodiment of the present invention.

FIG. 1 is a schematic diagram of a display device according to an exemplary embodiment of the present invention.

Referring to FIG. 1, the display device includes a thin film transistor array panel 10 and a plurality of tape-carrier packages (TCP) 50.

The thin film transistor array panel 10 is partitioned into a display area 13 that displays an image and a peripheral area 15 around the display area 13. A driving integrated circuit (IC) 55 is mounted on the TCP 50, and a tap adhesion tape (not shown) is attached to the peripheral area 15 of the thin film transistor array panel 10. The plurality of TCPs 50 is disposed with an interval therebetween.

A driving IC pad (not shown) that outputs a signal from the driving IC 55 is formed in the TCP 50, and a plurality of signal input pads (not shown) for receiving a signal that is applied from the driving IC 55 is provided in the thin film transistor array panel 10. The tap adhesion tape between the thin film transistor array panel 10 and the TCP 50 has a plurality of conductive leads that are electrically insulated to electrically connect the signal input pad and the driving IC pad.

A display area of a thin film transistor array panel according to an exemplary embodiment of the present invention is described in detail with reference to FIG. 2.

Figure 2:
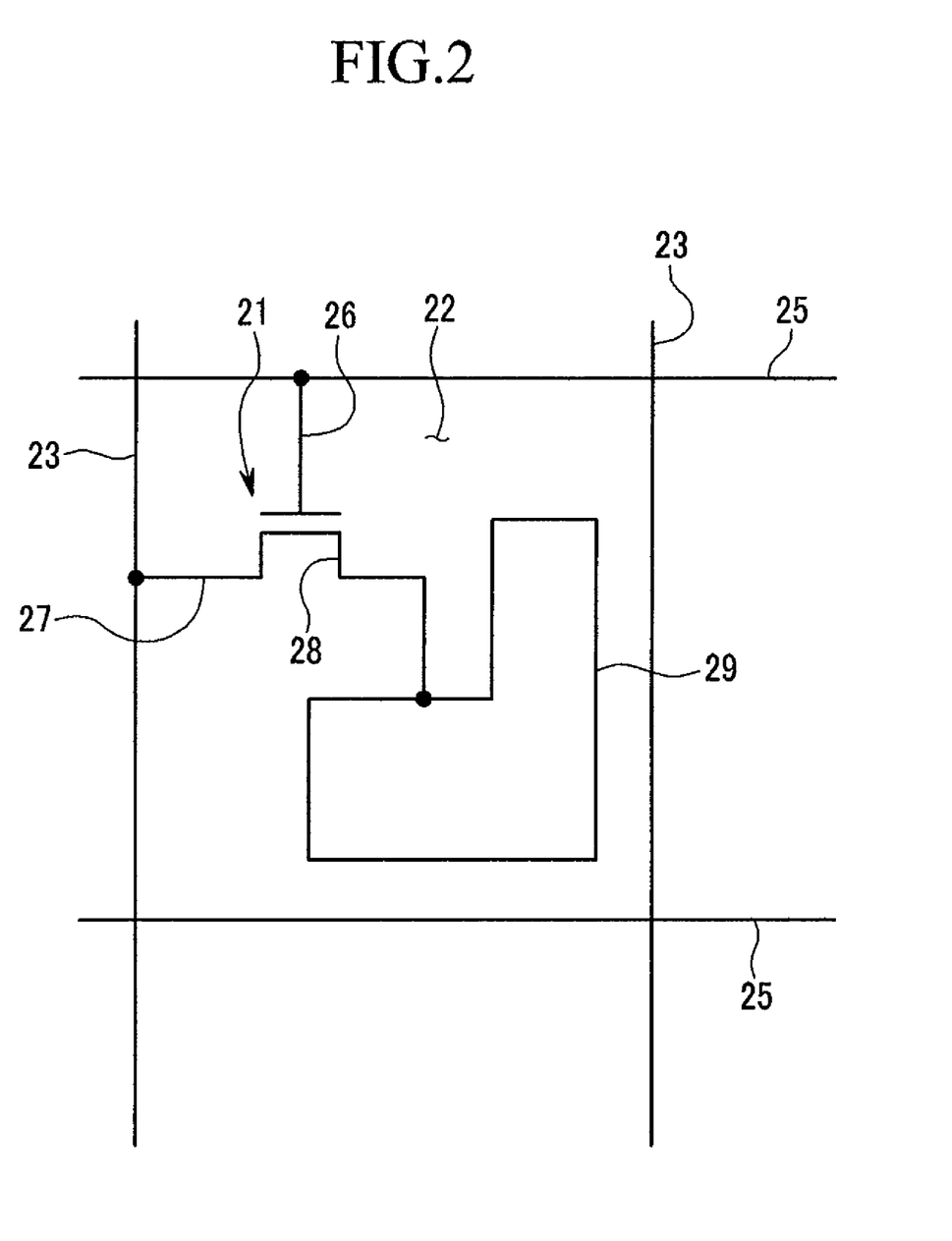
FIG. 2 is a diagram schematically illustrating a part B of a display area in a thin film transistor array panel of the display device that is shown in FIG. 1.

FIG. 2 is a diagram schematically illustrating a part B of a display area in a thin film transistor array panel of the display device that is shown in FIG. 1.

A plurality of signal lines is formed in the display area 13 of the thin film transistor array panel 10, for example gate lines 25 that are extended in a horizontal direction and data lines 23 that are insulated from the gate lines 25 and that intersect the gate lines 25. Referring to FIG. 1, the gate lines 25 and the data lines 23 are extended from the display area 13 to the peripheral area 15. A plurality of pixel electrodes 29 and a plurality of thin film transistors 21 are also formed in the display area 13, and are positioned within a region 22 that is surrounded by the gate lines 25 and the data lines 23. A gate electrode 26 of the thin film transistor 21 is connected to a gate line 25, a source electrode 27 thereof is connected to a data line 23, and a drain electrode 28 is connected to the pixel electrode 29.

Although a thin film transistor is illustrated in the embodiment of FIG. 2, it will be appreciated that several thin film transistors may exist.

Next, a peripheral area of a thin film transistor according to an exemplary embodiment of the present invention is described in detail with reference to FIGS. 3 to 5.

Figure 3:
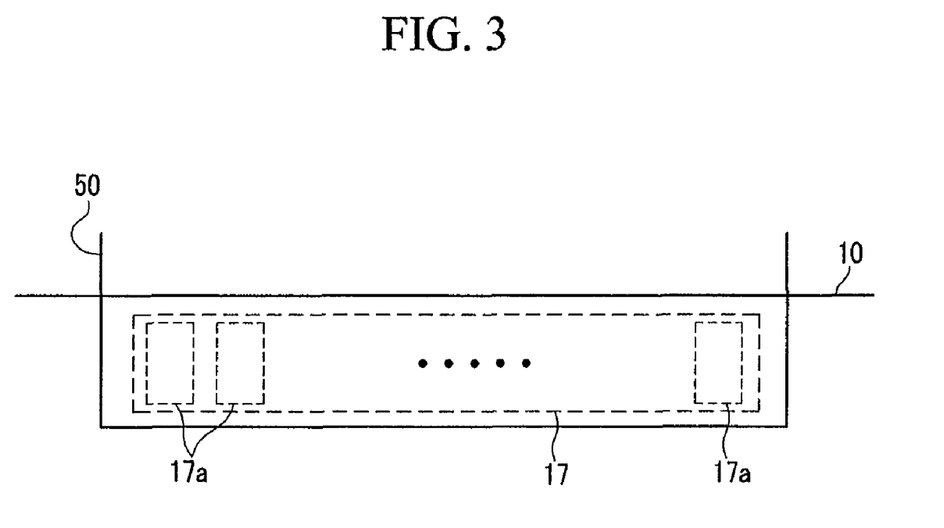
FIG. 3 is a diagram schematically illustrating a region A of a peripheral area in a thin film transistor array panel of the display device that is shown in FIG. 1.

FIG. 3 is a diagram schematically illustrating a region A of a peripheral area in a thin film transistor array panel of the display device that is shown in FIG. 1. FIG. 4 is a top plan view illustrating a pad block in a thin film transistor array panel according to an exemplary embodiment of the present invention, and FIG. 5 is a cross-sectional view of the pad block that is taken along line V-V of FIG. 4.

Referring to FIG. 3, a pad block region 17 to which the TCP 50 is attached is defined in the peripheral area 15 of the thin film transistor array panel 10. According to an embodiment, the pad block region 17 may have an approximate rectangular shape having a longitudinal side approximately parallel to a border of the panel 10 and a lateral side perpendicular thereto. For convenience of description, hereinafter, a longitudinal side direction of the pad block region 17 is referred to as a first direction and a lateral side direction thereof is referred to as a second direction. When a plurality of TCPs 50 is attached to the thin film transistor array panel 10, a plurality of pad block regions 17 may exist, and in this case, the plurality of pad block regions 17 is sequentially arranged along the first direction.

Each pad block region 17 may be partitioned further into a plurality of pad blocks 17a that are formed in the first direction.

Figure 4:
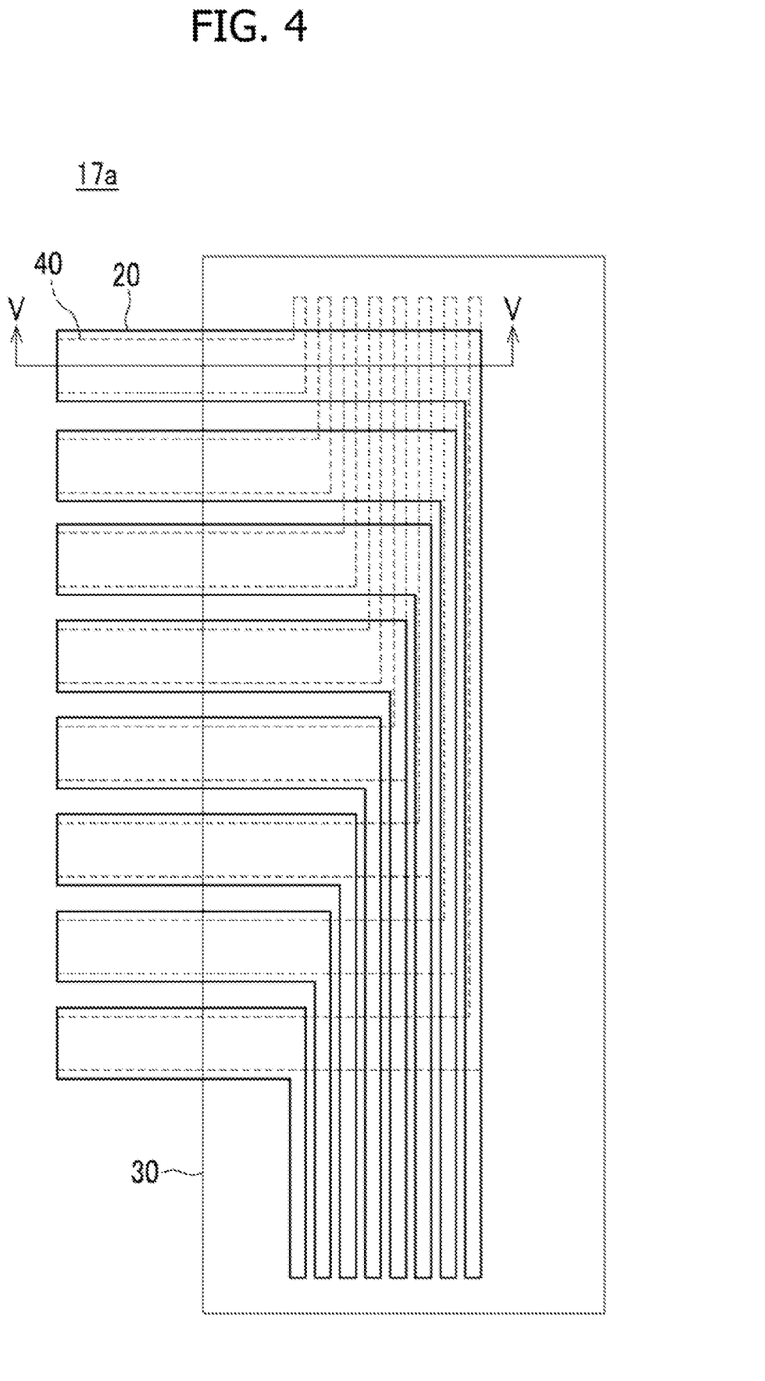
FIG. 4 is a top plan view illustrating a pad block in a thin film transistor array panel according to an exemplary embodiment of the present invention.

Referring to FIG. 4, a plurality of signal input pads 20 that are connected to the driving IC pad 40 to receive a signal from the driving IC 55 are formed within each pad block 17a. Each signal input pad 20 may have an approximate rectangular shape, a longitudinal side thereof is extended in the first direction and a lateral side thereof is extended in a second direction, and a plurality of signal input pads 20 is sequentially arranged in the second direction. The signal input pad 20 is sharply turned and extended from a signal line that is extended in the second direction, and the signal line may be any one of the gate lines 25 and the data lines 23 that are shown in FIG. 2.

When the quantity of the pad block regions 17 is two or more, an interval between the pad block regions 17 may be much greater than that between signal lines within each pad block region 17. This is because the signal lines may sustain an almost identical interval within the display area 13, but closely gather on a group basis in a process of advancing to each pad block region 17.

Figure 5:
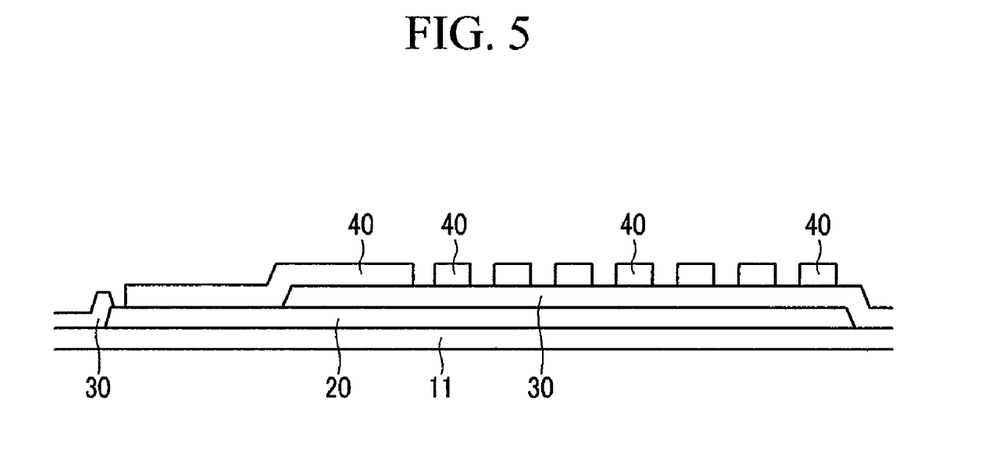
FIG. 5 is a cross-sectional view of the pad block that is taken along line V-V of FIG. 4.

Referring to FIG. 5, the signal input pad 20 is formed on a base substrate 11, and the base substrate 11 may be, for example, a flexible substrate made of a material such as plastic or polyether-sulphone (PES). An insulating layer (not shown) may exist between the signal input pad 20 and the base substrate 11.

A part of the signal input pad 20 and the signal line are covered by a passivation layer 30, and the driving IC pad 40 is formed on an exposed portion of the signal input pad 20 and the passivation layer 30. Driving IC pads 40 are arranged in a one-to-one correspondence with the signal input pads 20 and are bent and rise in a direction opposite to that of the signal lines, i.e., an upward direction in FIG. 4. The driving IC pads 40 are electrically connected in a one-to-one correspondence to the signal input pads 20 in an area where the passivation layer 30 does not exist.

The passivation layer 30 protects the signal input pads 20 and prevents a short circuit between the signal input pads 20 and the driving IC pads 40. Another insulating layer may exist between the signal input pads 20 and the passivation layer 30.

In such a structure, even if the base substrate 11 is expanded due to a thermal process of forming a thin film structure on the base substrate 11, a possibility in which a failure may occur in the connection between the signal input pad 20 and the driving IC pad 40 is much decreased, and this is described in detail with reference to FIG. 6.

Figure 6:
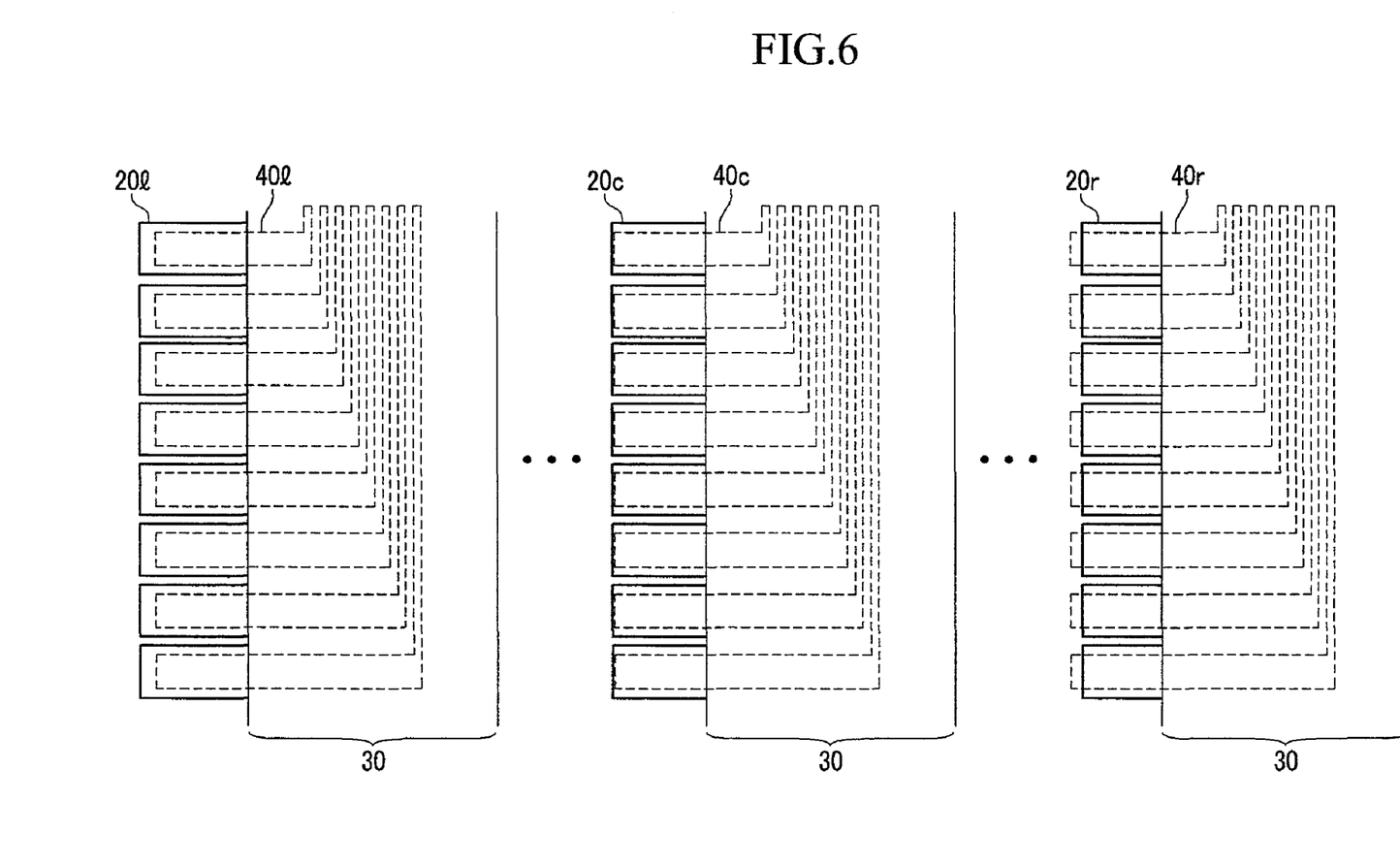
FIG. 6 is a diagram illustrating a pad block region when a thin film transistor array panel according to an exemplary embodiment of the present invention is extended due to heat expansion.

FIG. 6 is a diagram illustrating a pad block region when a thin film transistor array panel according to an exemplary embodiment of the present invention is extended due to heat expansion.

As shown in FIG. 6, because a lateral direction length of a pad block region is much longer than a vertical direction length thereof, when thermal expansion occurs, the lateral direction length thereof becomes much longer. However, because signal input pads 20l, 20c, and 20r are long in a lateral direction and an interval between the pad blocks is wide, the connection between the driving IC pads 40l, 40c, and 40r is smoothly performed, so that a probability that a short circuit failure may occur is very low.

In a case of a conventional structure, a signal input pad is formed long in a width direction of a pad block region 17. One pad block region 17 may have an area of about 2700 μm (length)×1200 μm (width), and 268 signal input pads may be included in one pad block region 17. Therefore, an occupying area of 8 signal input pads is approximately 800 μm×1200 μm, and in this case, a width and an interval of the signal input pad are about 50 μm.

While sustaining a width of the signal input pad, as shown in FIG. 4, when setting 8 signal input pads 20 to one pad block and rearranging 8 signal input pads 20 in an area of 800 μm×1200 μm, an interval between the signal input pads 20 may be about 100 μm within the pad block.

According to an embodiment, a material of the base substrate 11 of the thin film transistor array panel 10 is polyether-sulphone (PES) in which a thermal expansion coefficient is 50 PPM, a material of the TCP 50 is polyimide in which a thermal expansion coefficient is 20 PPM, and a heat process temperature for bonding the TCP 50 to the thin film transistor array panel 10 is about 180□.

Thereafter, the pad block region 17 having the above-described size is expanded by about 209 μm in a length direction after a thermal process, and the TCP 50 is expanded by about 84 μm after a thermal process. That is, heat expansion lengths of the pad block region 17 and the TCP 50 have a difference of about 125 μm. The difference of about 75 μm in the left side and about 75 μm in the right side exists from the center of the pad block region 17. In a conventional structure, because a width and an interval of the signal input pad are 50 μm, the driving IC pad and the signal input pad are not properly connected and thus a short circuit failure in which different pads are connected occurs.

However, as shown in FIG. 6, according to an embodiment of the present invention, such a failure does not occur.

Because a heat expansion length is about 9.3 μm in a width direction of the pad block region 17, in one or more embodiments of the present invention, erroneous alignment does not occur.

A method of manufacturing a display device according to an exemplary embodiment of the present invention will now be described in detail with reference to FIGS. 1 to 5 and 7 to 9.

Figure 7:
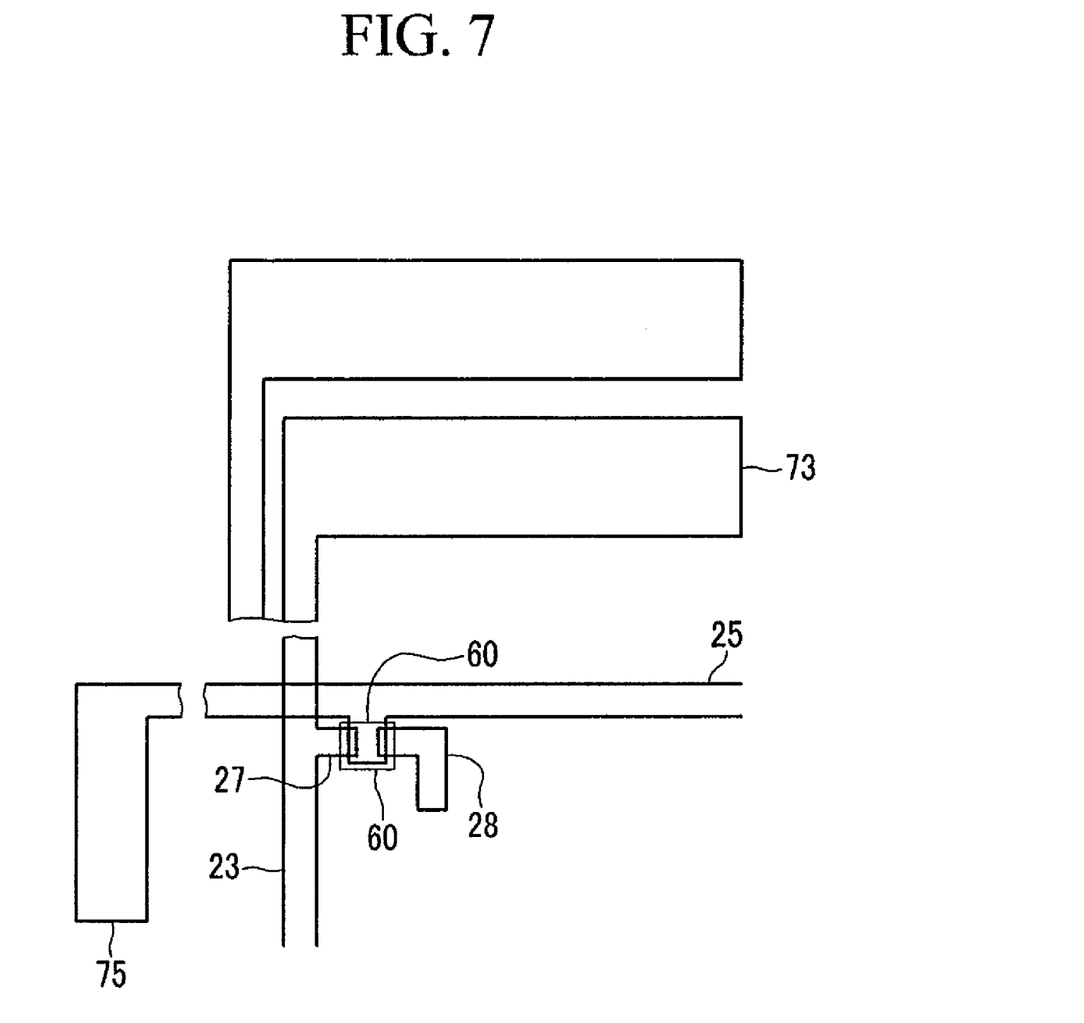
FIGS. 7 to 9 are layout views sequentially illustrating a method of manufacturing a display device according to an exemplary embodiment of the present invention.
Figure 8:
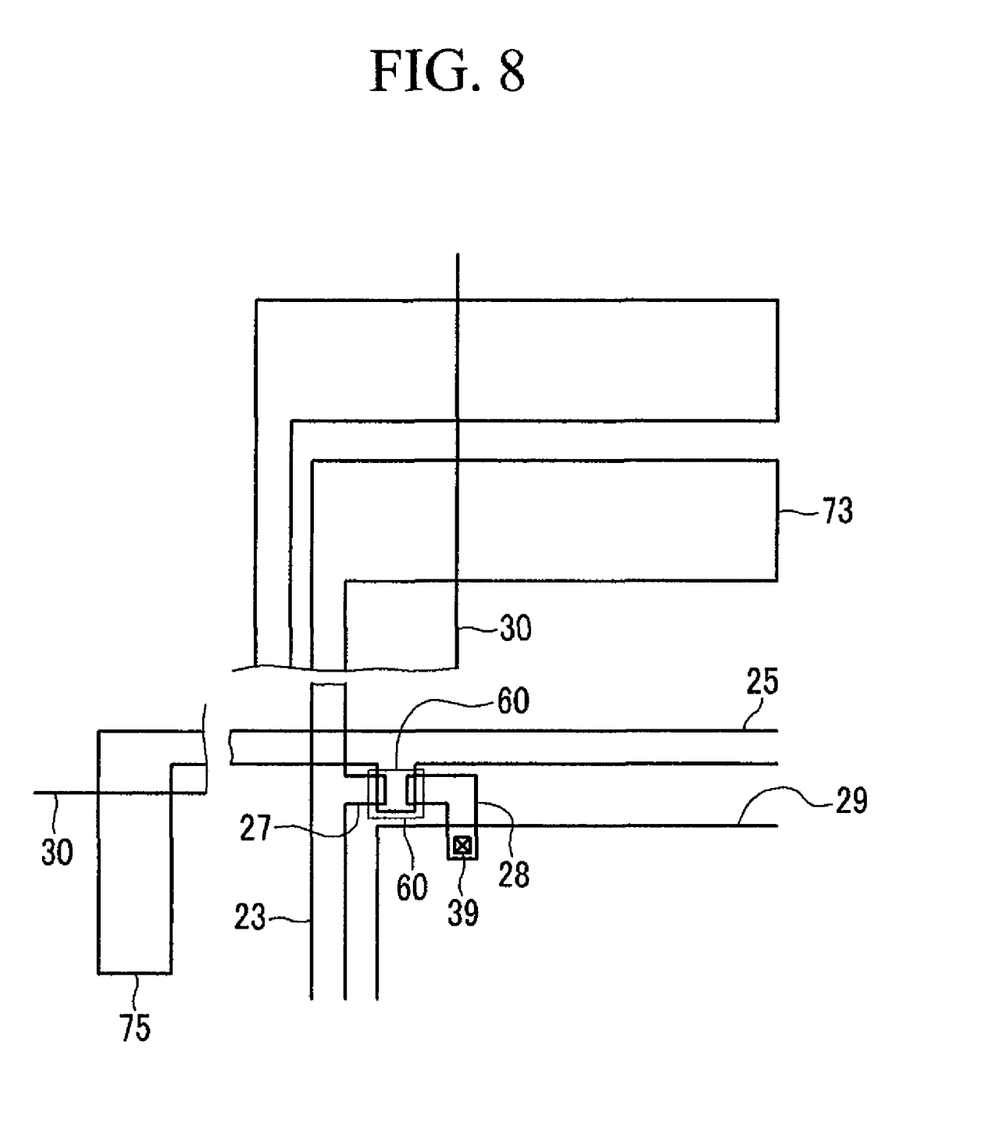
Figure 9:
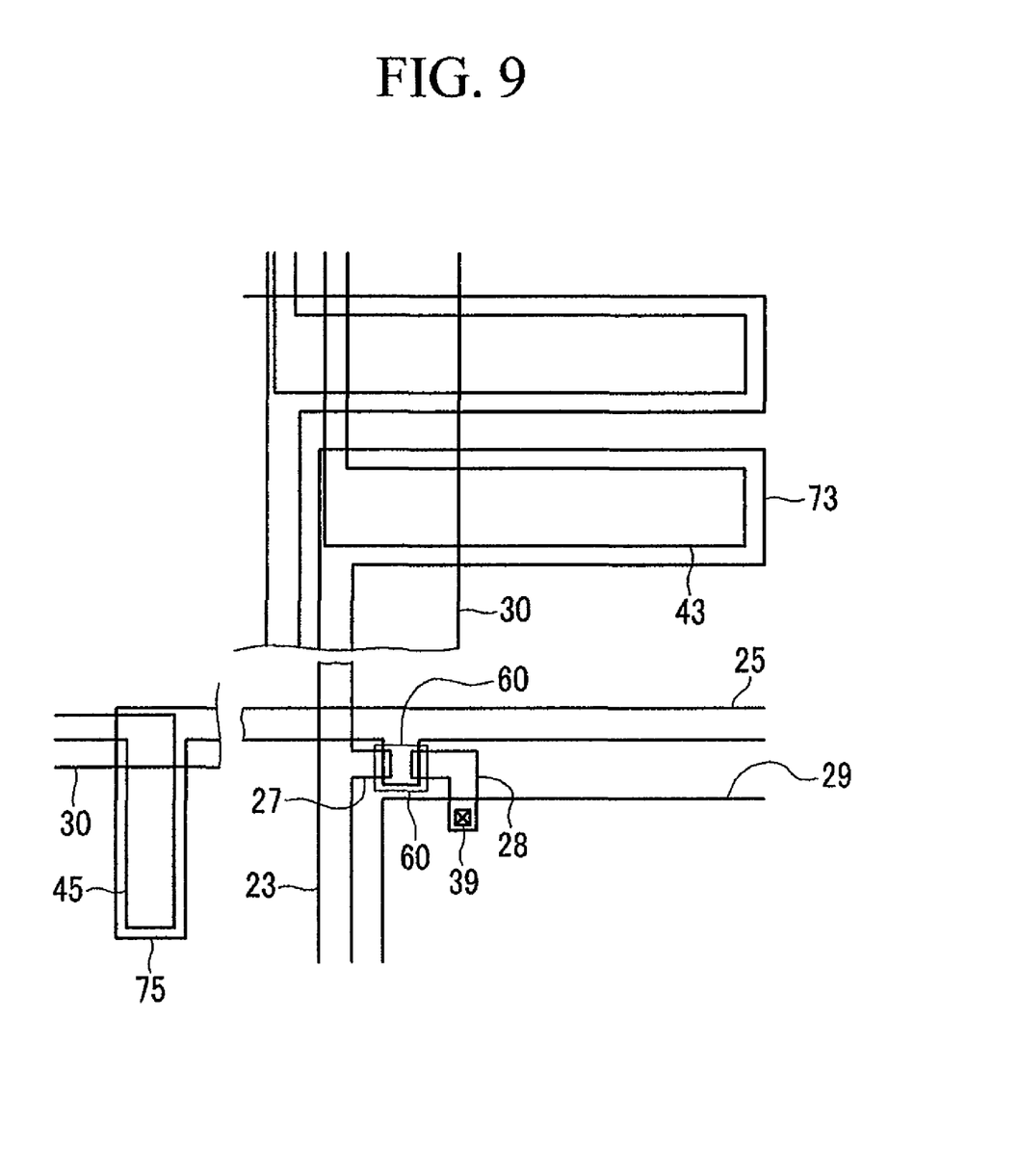

FIGS. 7 to 9 are layout views sequentially illustrating a method of manufacturing a display device according to an exemplary embodiment of the present invention.

Referring to FIG. 7, a first conductive layer (not shown) is formed on the base substrate 11 through a deposition method using a chemical vapor deposition (CVD) method, a physical vapor deposition (PVD) method, or a sputtering method. As a material of the first conductive layer, at least one of Cr, MoW, Cr/Al, Cu, Al (Nd), Mo/Al, Mo/Al (Nd), and Cr/Al (Nd) may be used. The first conductive layer may be formed as a multilayer.

After coating a photosensitive film (not shown), a first photosensitive film mask pattern is formed by performing a lithography process using a first mask (not shown). By performing an etching process that uses the first photosensitive film mask pattern as an etching mask, a gate line 25 and a gate pad 75 are formed. Thereafter, the first photosensitive film mask pattern is removed by performing a strip process. In this case, the gate line 25 is formed in both the display area 13 and the peripheral area 15, but the gate pad 75 is formed in only a pad block region 17 of the peripheral area 15. The gate pad 75 is formed long in the vertical direction, and the pad block region 17 corresponding thereto is also formed long in the vertical direction. However, the gate line 25 may be extended in the horizontal direction.

Next, after a gate insulating layer (not shown), an active layer (not shown), and an ohmic contact layer (not shown) are sequentially stacked, by etching an ohmic contact layer and an active layer using a second photosensitive film mask pattern (not shown), an active region structure of the thin film transistor is formed.

The gate insulating layer may be deposited by a plasma-enhanced chemical vapor deposition (PECVD) method, a sputtering method, etc., and as a material of the gate insulating layer, an inorganic insulating material including silicon oxide or silicon nitride may be used. An active layer and an ohmic contact layer may be also deposited by the above-described method. An amorphous silicon layer may be used as a material of the active layer, and an amorphous silicon layer in which silicide or an N-type impurity is doped in a high concentration may be used as a material of the ohmic contact layer.

When etching the ohmic contact layer and the active layer, after coating a photosensitive film (not shown) on the ohmic contact layer, a second photosensitive film mask pattern is formed using a photolithography process that uses a second mask (not shown). By performing an etching process that uses the second photosensitive film mask pattern as an etching mask and that uses a gate insulating layer as an etching stop layer, an exposed portion of the active layer and the ohmic contact layer is removed. Thereafter, by performing a strip process, the remaining second photosensitive film mask pattern is removed.

Next, after a second conductive layer (not shown) is formed on the entire structure, by performing an etching process that uses a third photosensitive film mask pattern (not shown), a data pad 73, a drain electrode 28, and a data line 23 including a source electrode 27 are formed. Specifically, the second conductive layer (not shown) is first formed on the entire substrate through a deposition method using a CVD method, a PVD method, or a sputtering method. In this case, the second conductive layer may be a single layer or a multilayer that is made of at least one of Mo, Al, Cr, and Ti. The second conductive layer may be made of the same material as that of the first conductive layer. Thereafter, after coating a photosensitive film (not shown) on the second conductive layer, by performing a lithography process using the third mask (not shown), a third photosensitive film mask pattern is formed. By performing an etching process using the third photosensitive film mask pattern as an etching mask, the second conductive layer is etched, whereby the data line 23, the data pad 73, and the drain electrode 28 are completed.

In this case, the data line 23 is formed in both the display area 13 and the peripheral area 15, but the drain pad 73 is formed in only a pad block region 17 of the peripheral area 15. The drain pad 73 is formed long in the horizontal direction and the pad block region 17 corresponding thereto is also formed long in the horizontal direction. The data line 23 may be extended in the vertical direction.

Thereafter, by removing an ohmic contact layer in a region that is not covered with the data line 23 and the drain electrode 28 by performing etching using the third photosensitive film mask pattern as an etching mask, a structure of an active region of the thin film transistor is completed.

Referring to FIG. 8, the passivation layer 30 is formed, and a part of the passivation layer 30 and a part of the gate insulating layer are removed through an etching process using a fourth photosensitive film mask pattern (not shown). In this case, a contact hole 39 is formed on the drain electrode 28, and the passivation layer 30 that is positioned at the gate pad 75 and a part on the data pad 73 is also removed. The passivation layer 30 may be made of the same insulating material as that of the gate insulating layers. Further, the passivation layer 30 may be formed as a multilayer, for example in two layers, one layer of an inorganic passivation layer and another layer of an organic passivation layer.

Next, after a third conductive layer (not shown) is formed on the patterned passivation layer 30, a pixel electrode 29 is formed by patterning the third conductive layer using a fifth photosensitive film mask pattern (not shown). Here, the third conductive layer may be a transparent conductive layer including indium tin oxide (ITO) or indium zinc oxide (IZO).

Next, referring to FIG. 9, a driving IC pad 40 (shown for example in FIG. 4) is bonded on the passivation layer 30, the data pad 73, and the gate pad 75 of the pad block region 17. Specifically, an anisotropy conductive film (not shown) is first attached on the gate pad 75 and the data pad 73. After aligning the driving IC pad 40 of the TCP 50 in which the driving IC 55 is mounted with the gate pad 75 and the data pad 73 and pressing the driving IC pad 40, an adhesion process is completed by performing thermo-compression. In this case, the thermo-compression temperature may be about 150□-200□.

The present exemplary embodiment exemplifies only a TCP, but this is only an illustration, and a material having more excellent flexibility than the TCP may be used and be applied to even a pad structure of a Chip on Film (COF) technology that may be freely bent to an angle of 90° or more at any position.

As described above, according to one or more embodiments of the present invention, in a process of manufacturing a display device, even if erroneous alignment occurs due to expansion or contraction of a flexible substrate, by advancing a signal input pad structure that is connected to the driving IC, a process margin in which a process failure may be reduced may be secured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
    a base substrate that has a display area and a peripheral area;
    a plurality of thin film transistors that are formed in the display area;
    a plurality of signal input pads that are formed in the peripheral area and that are more elongated in a first direction than a second direction substantially perpendicular to the first direction; and
    a plurality of signal lines that are connected to the thin film transistors and to the signal input pads,
    wherein at least a part of the plurality of signal input pads in the first direction is aligned with each other, and at least two of the plurality of signal input pads in the second direction have different length in the first direction and
    direction, wherein the plurality of signal lines extend in the second direction in the display area, and wherein the signal input pads and pad block region are elongated in the same direction.

2. The thin film transistor array panel of claim 1, wherein at least a part of the plurality of signal input pads is sequentially arranged along the second direction.

3. The thin film transistor array panel of claim 2, wherein the plurality of signal input pads is arranged at a predetermined interval in the first direction and at a predetermined interval in the second direction within a pad block region, and a length of the pad block region in the first direction is longer than a length thereof in the second direction.

4. The thin film transistor array panel of claim 2, wherein the plurality of signal input pads is formed in a plurality of pad block regions,
- a distance between adjacent pad blocks is greater than a distance between two of the input signal pads adjacent in the first direction within each of the pad block regions, and
- a length of each pad block region in the first direction is longer than a length thereof in the second direction.

5. The thin film transistor array panel of claim 1, wherein the plurality of signal input pads is disposed adjacent to an edge of the base substrate parallel to the first direction.

6. The thin film transistor array panel of claim 1, wherein each thin film transistor has a gate electrode, a source electrode, and a drain electrode, and
- the signal lines are connected to the source electrodes of the thin film transistors.

7. The thin film transistor array panel of claim 1, wherein each thin film transistor has a gate electrode, a source electrode, and a drain electrode, and
- the signal lines are connected to the gate electrodes of the thin film transistors.

8. The thin film transistor array panel of claim 1, further comprising a passivation layer that is formed on the signal lines and a part of the signal input pads.

9. The thin film transistor array panel of claim 1, wherein the base substrate is flexible.

10. A thin film transistor array panel comprising:
- a base substrate;
- a plurality of thin film transistors that are formed on the base substrate;
- a plurality of signal input pads that are disposed adjacent to an edge of the base substrate and are elongated in a first direction parallel to the edge of the base substrate, wherein a pad block region where the plurality of signal input pads are arranged is elongated parallel to the edge of the base substrate; and
- a plurality of signal lines that are connected to the thin film transistors and the signal input pads, wherein at least two of the signal input pads have a different length in a same direction, and wherein the signal input pads and the pad block region are elongated in the same direction.

11. The thin film transistor array panel of claim 10, wherein the plurality of signal input pads is sequentially arranged along the first direction and along a second direction substantially perpendicular to the first direction.

12. The thin film transistor array panel of claim 11, wherein the plurality of signal input pads is arranged at a predetermined interval in the first direction and at a predetermined interval in the second direction within a pad block region, and
- a length of the pad block region in the first direction is longer than a length thereof in the second direction.

13. The thin film transistor array panel of claim 11, wherein the plurality of signal input pads is formed in a plurality of pad block regions,
- a distance between adjacent pad blocks is greater than a distance between two of the input signal pads adjacent in the first direction within each pad block region, and
- a length of each pad block region in the first direction is longer than a length thereof in the second direction.

14. The thin film transistor array panel of claim 10, wherein the plurality of signal lines extends in a second direction in the display area.

15. The thin film transistor array panel of claim 10, wherein each thin film transistor has a gate electrode, a source electrode, and a drain electrode, and
- the signal lines are connected to the source electrodes of the thin film transistors.

16. The thin film transistor array panel of claim 10, wherein each thin film transistor has a gate electrode, a source electrode, and a drain electrode, and
- the signal lines are connected to the gate electrodes of the thin film transistors.

17. The thin film transistor array panel of claim 10, further comprising a passivation layer that is formed on the signal lines and a part of the signal input pads.

18. The thin film transistor array panel of claim 10, wherein the base substrate is flexible.

19. A thin film transistor array panel comprising:
- a base substrate that has a display area and a peripheral area;
- a plurality of thin film transistors that are formed on the display area;
- a plurality of signal input pads that are disposed in the peripheral area and are elongated in a first direction; and wherein at least two of the signal input pads have a different length in the first direction;
- a plurality of signal lines that are connected to the thin film transistors and the signal input pads and that extend in a second direction substantially perpendicular to the first direction in the display area, and wherein the signal input pads and the pad block region are elongated in the same direction.

20. The thin film transistor array panel of claim 19, wherein the plurality of signal input pads is sequentially arranged along the first direction and along the second direction.

21. The thin film transistor array panel of claim 20, wherein the plurality of signal input pads is arranged at a predetermined interval in the first direction and at a predetermined interval in the second direction within a pad block region, and
- a length of the pad block region in the first direction is longer than a length thereof in the second direction.

22. The thin film transistor array panel of claim 20, wherein the plurality of signal input pads is formed in a plurality of pad block regions,
- a distance between adjacent pad blocks is greater than a distance between two of the input signal pads adjacent in the first direction within each pad block region, and
- a length of each pad block region in the first direction is longer than a length thereof in the second direction.

23. The thin film transistor array panel of claim 19, wherein each thin film transistor has a gate electrode, a source electrode, and a drain electrode, and
- the signal lines are connected to the source electrodes of the thin film transistors.

24. The thin film transistor array panel of claim 19, wherein each thin film transistor has a gate electrode, a source electrode, and a drain electrode, and
- the signal lines are connected to the gate electrodes of the thin film transistors.

25. The thin film transistor array panel of claim 19, further comprising a passivation layer that is formed on the signal lines and a part of the signal input pads.

26. The thin film transistor array panel of claim 19, wherein the base substrate is flexible.

* * * * *